(12) United States Patent  
McClure

(10) Patent No.: US 6,456,519 B1
(45) Date of Patent: Sep. 24, 2002

(54) CIRCUIT AND METHOD FOR ASYNCHRONOUSLY ACCESSING A FERROELECTRIC MEMORY DEVICE

(75) Inventor: David C. McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/752,209

(22) Filed: Dec. 29, 2000

(51) Int. Cl.[7] ............................................... G11C 11/22
(52) U.S. Cl. .................... 365/145; 365/65; 365/230.06; 365/230.08; 365/233
(58) Field of Search .......................... 365/65, 145, 233, 365/230.06, 230.08, 233.5, 149

(56) References Cited

U.S. PATENT DOCUMENTS 5,892,706 A * 4/1999 Shimizu et al. ............. 365/145
6,125,051 A * 9/2000 Kang .......................... 365/145
6,178,138 B1 * 1/2001 Derbenwick et al. ....... 365/233
6,208,550 B1 * 3/2001 Kim ............................ 365/145

* cited by examiner

Primary Examiner—David Nelms
Assistant Examiner—Gene N. Auduong
(74) Attorney, Agent, or Firm—Lisa K. Jorgenson; Andre Szuwalski

(57) ABSTRACT

A circuit and method are disclosed for asynchronously accessing accessing a ferroelectric memory device. The ferroelectric memory device internally generates timing signals for latching a received address signal and driving the row lines of the device based upon transitions appearing on the received address signal. The circuit receives an address signal and asserts an edge detect signal in response. The address signal is latched following the edge detect a signal being asserted. Address decode circuitry receives the latched address and generates decoded output signals that identify a row of memory cells to be accessed. In this way, a ferroelectric memory device may effectively replace an asynchronous static random access random access memory (SRAM) device.

21 Claims, 7 Drawing Sheets

CIRCUIT AND METHOD FOR ASYNCHRONOUSLY ACCESSING A FERROELECTRIC MEMORY DEVICE

BACKGROUND OF THE INVENTION

1. Technical Field of the Invention

The present invention relates to accessing a ferroelectric memory device, and particularly to a circuit and method for asynchronously accessing a ferroelectric memory device.

2. Description of the Related Art

Ferroelectricity is a phenomenon which can be observed in a relatively small class of dielectrics called ferroelectric materials. In a normal dielectric, upon the application of an electric field, positive and negative charges will be displaced from their original position—a concept which is characterized by the dipole moment or polarization. This polarization or displacement will vanish, however, when the electric field returns back to zero. In a ferroelectric material, on the other hand, there is a spontaneous polarization—a displacement which is inherent to the crystal structure of the material and does not disappear in the absence of the electric field. In addition, the direction of this polarization can be reversed or reoriented by applying an appropriate electric field.

These characteristics result in ferroelectric capacitors, formed from ferroelectric film or material disposed between parallel conduction plates, being capable of storing in a nonvolatile manner a first charge corresponding to a first polarization state in which the direction of polarization is in a first direction, and a second charge corresponding to a second polarization state in which the direction of polarization is in a second direction opposite the first direction. Ferroelectric capacitors are utilized in nonvolatile random access memory devices having a memory cell array architecture that is similar to the memory cell array architecture of dynamic random access memory (DRAM) devices.

In general terms, there are two types of ferroelectric memory cells. Referring to FIG. 1A, a one transistor, one capacitor (1T1C) memory cell utilizes a pass gate transistor T connected between a column line B and a first plate of ferroelectric capacitor C. A second plate of ferroelectric capacitor C is connected to a plate line P. The gate terminal of pass gate transistor T is connected to a word line W. A memory device utilizing a 1T1C memory cell uses a reference memory cell that is accessed at the same time the 1T1C memory cell is accessed so as to provide a charge differential appearing across a pair of column lines coupled to the 1T1C cell and the reference cell. The use of 1T1C ferroelectric memory cells is known in the art.

Referring to FIG. 1B, a two transistor, two capacitor (2T2C) memory cell includes two ferroelectric capacitors C1 and C2. A first pass gate transistor T1 is connected between a first plate of ferroelectric capacitor C1 and a first column line BL of a column line pair. A second pass gate transistor T2 is connected between a first plate of ferroelectric capacitor C2 and a second column line BL' of the column line pair. A second plate of ferroelectric capacitors C1 and C2 is connected to a plate line P. The gate terminal of pass gate transistors T1 and T2 is connected to the word line W. Each capacitor C1 and C2 stores a charge representative of the polarization state thereof, the charge combining with the charge of the other capacitor to result in a charge differential appearing across column lines BL and BL' when the 2T2C memory cell is accessed. The polarity of the charge differential denotes the binary value stored by the 2T2C memory cell. The use of 2T2C ferroelectric memory cells is known in the art.

Because ferroelectric random access memory (FRAM) devices are non-volatile, existing FRAM devices have been used to replace static random access memory (SRAM) devices, such as SRAM devices in low power applications. One complication in replacing SRAM devices is in reconciling the asynchronous operation of some SRAM devices with the synchronous operation of existing FRAM devices. In particular, because ferroelectric memory cells are destructively read, it is necessary to restore the data in the addressed memory cells during a memory read operation. Aborted memory read operations or address cycles being less than the minimum address cycle could corrupt data stored in the addressed memory cells. Consequently, memory access operations of FRAM devices are typically synchronous, in which addresses are sampled at the falling edge of the chip enable signal. In other words, the chip enable signal is used as a clock signal, such that each memory access operation requires the chip enable signal transition to the de-asserted state to latch the received address and transition to the asserted state to initiate a next memory access operation.

In contrast, conventional SRAM devices are asynchronous, in that memory access operations are executed without latching the address signals relative to a clock signal applied to the SRAM device. SRAM devices are capable of performing asynchronous memory access operations because memory read operations of an SRAM device are not destructive. Based upon the foregoing, there is a need to provide an FRAM device that is asynchronous and/or otherwise capable of effectively replacing asynchronous SRAM devices without unnecessarily limiting the operation of the system in which the SRAM device is disposed.

SUMMARY OF THE INVENTION

Embodiments of the present invention overcome shortcomings in existing FRAM devices and satisfy a significant need for an asynchronous FRAM device that is capable of effectively replacing an SRAM device. An embodiment of the present invention is an FRAM device that internally generates timing signals for latching a received address signal and driving the row lines of the FRAM device based upon transition s appearing on the received address signal. In particular, the FRAM device includes an address input buffer for receiving an address signal during a memory access operation, asserting an edge detect signal in response to at least one edge transition appearing on a bit of the address signal, and latching the address signal following the assertion of the edge detect signal. The FRAM device further includes address decode circuitry for receiving the latched address signal and generating decoded output signals identifying a row of memory cells to be accessed. By generating the edge detect signal in this manner and latching the address signal based upon the edge detect signal, the FRAM device behaves in a system a s an asynchronous FRAM device.

The FRAM device performs a memory access operation by asserting the edge detect signal in response to at least one edge transition appearing on the bit of the address signal; latching the address signal following the assertion of the edge detect signal; equilibrating and precharging column lines of the FRAM device and driving the row lines thereof to a low reference voltage level when the edge detect signal is asserted; receiving the latched address signal and generating decoded output signals identifying a row of memory cells to connect to the column lines based on the latched address signal; and coupling at least one selected column line to data input/output terminals of the ferroelectric memory device.

BRIEF DESCRIPTION OF THE DRAWINGS

A more complete understanding of the system and method of the present invention may be obtained by reference to the following Detailed Description when taken in conjunction with the accompanying Drawing wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 2:
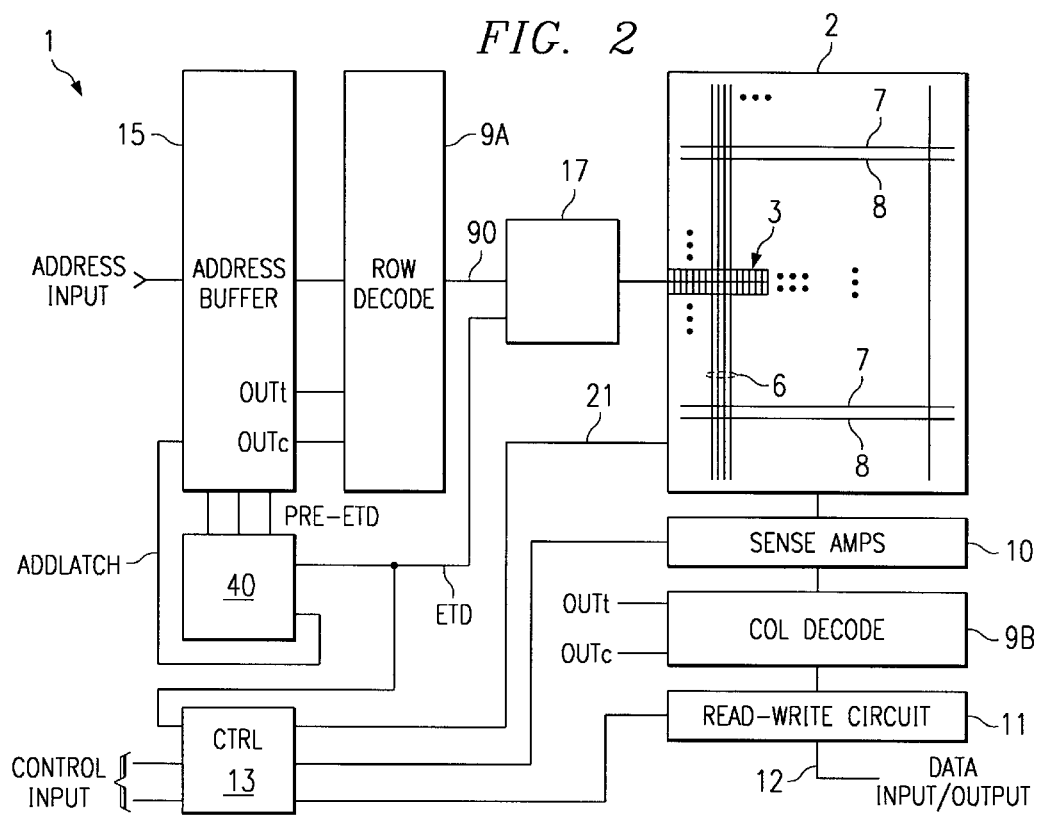
FIG. 2 is a ferroelectric memory device according to an embodiment of the present invention.

Referring to FIG. 2, there is shown a memory device 1 according to a first embodiment of the present invention. Memory device 1 is a nonvolatile memory device, such as a random access ferroelectric memory device. It is understood, however, that memory device 1 may be other memory devices as well. For instance, memory device 1 may be other memory devices having destructive read operations.

In addition, memory device 1 may itself form an integrated circuit or be a memory device that is embedded with other circuitry within an integrated circuit chip.

Figure 1A:
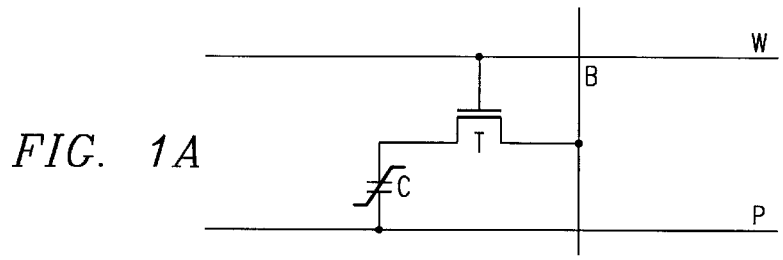
FIGS 1A and 1B are schematics of 1T1C and 2T2C ferroelectric memory cells, respectively.
Figure 1B:
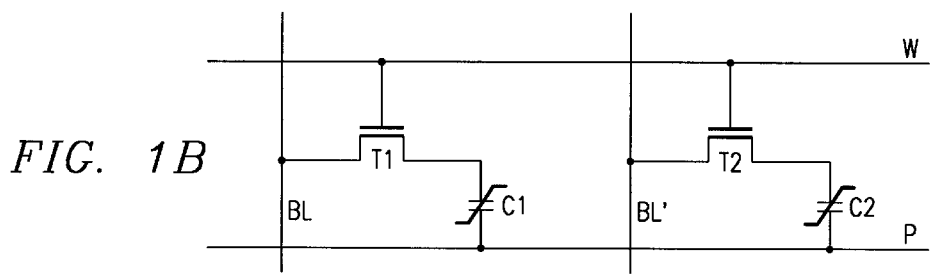

Memory device 1 includes a memory cell array 2 of memory cells 3. Memory cells 3 may be ferroelectric memory cells that include one or more ferroelectric capacitor elements. Memory cell 3 may be implemented as a one transistor, one capacitor (1T1C) memory cell (FIG. 1A). Alternatively, memory cell 3 may be implemented as a two transistor, two capacitor (2T2C) memory cell (FIG. 1B).

It is understood that each memory cell 3 may be implemented in other ways using one or more ferroelectric capacitive elements or similar elements.

Memory cell array 2 is arranged into rows and columns of memory cells 3. The memory cells 3 in a row of memory cells 3 are connected to a distinct word line 7 and a distinct plate line 8. The memory cells 3 in a column of memory cells 3 are connected to a distinct column line 6 or pair 5 thereof.

FIG. 2 shows plate lines 8 being parallel to word lines 7. In this configuration, plate lines 8 can be coupled to more than one row of memory cells 3. Alternatively, it is understood that plate lines 8 may be perpendicular to word lines 7. In this configuration, the voltage appearing across the ferroelectric capacitors in the memory cells 3 in rows that are not being accessed will not vary when the plate line 8 connected to such memory cells 3 is asserted. This is due to the fact that the transistor(s) in the unaccessed memory cells 3 are turned off, so the plate connected to the transistor simply follows the voltage change appearing on the capacitor plate connected to the asserted plate line 8. In either the parallel or perpendicular configuration, it is understood that back plate lines 8 may be partitioned into smaller segments so that back plate lines 8 may be more easily driven.

Memory device 1 may include an address input buffer 15 which receives the address value provided to memory device 1 and generates a true and a complement version of the address value. The true version, output signal OUTt, and the complement version, output signal OUTc, may be generated by address input buffer 15 with necessary timing so as to substantially prevent a false address selection.

Memory device 1 further includes address logic, such as a row decoder circuit 9A, which receives and decodes true output signal OUTt and complement output signal OUTc from address input buffer 15. Row decoder circuit 9A generates a plurality of decoded output signals 90. In a normal mode of operation, output signals 90 identify a single row line 7 to be driven so as to connect the corresponding row of memory cells 3 to column lines 6. Row decoder circuit 9A may be implemented with combination logic so as to receive the true and complement versions of the address value. The decoded output signals 90 are received by a row line control circuit 17, which thereupon drives the row line 7 corresponding to the value of the decoded output signals 90 to a voltage level that connects the memory cells 3 in the associated row to column lines 6.

Memory device 1 further includes a column decoder circuit 9B, which also receives and decodes true output signal OUTt and complement output signal OUTc from address input buffer 15. Based upon the decoded signals OUTt and OUTc, column decoder circuit 9B couples one or more column lines 6 to data input/output bus 12.

Sense amplifiers 10 are controlled to sense a charge differential appearing across a pair of column lines 6 and drive the column lines 6 to the high voltage reference Vdd and low voltage reference Vss based upon the polarity of the charge differential. Input/output (I/O) block 11 serves as an interface between column lines 6 and the external data input/output bus 12. A control circuit 13 provides necessary timing and control signals to memory cell array 2, address logic 9A and 9B, sense amplifiers 10 and data input/output block 11 to preform read and write memory access operations.

Memory device 1 is shown in FIG. 2 as having a bidirectional external data bus 12. It is understood that memory device 1 may include separate unidirectional data input and data output buses instead.

As stated above, it is desirable to have a memory device 1, such as a ferroelectric memory device associated with a destructive read operation, be able to effectively replace an asynchronous SRAM device without incurring a reduction in data integrity and without substantially altering the way in which the memory device is accessed. In accordance with a first embodiment of the present invention, memory device 1 includes timing and control circuitry for generating control signals that latch signal representations of the address signal applied to memory device 1 based upon signal transitions occurring in the address signal, and driving the row lines 17 of memory device 1 based upon the latched address. The timing and control circuitry is associated with the circuitry within address input buffer 15.

Figure 3:
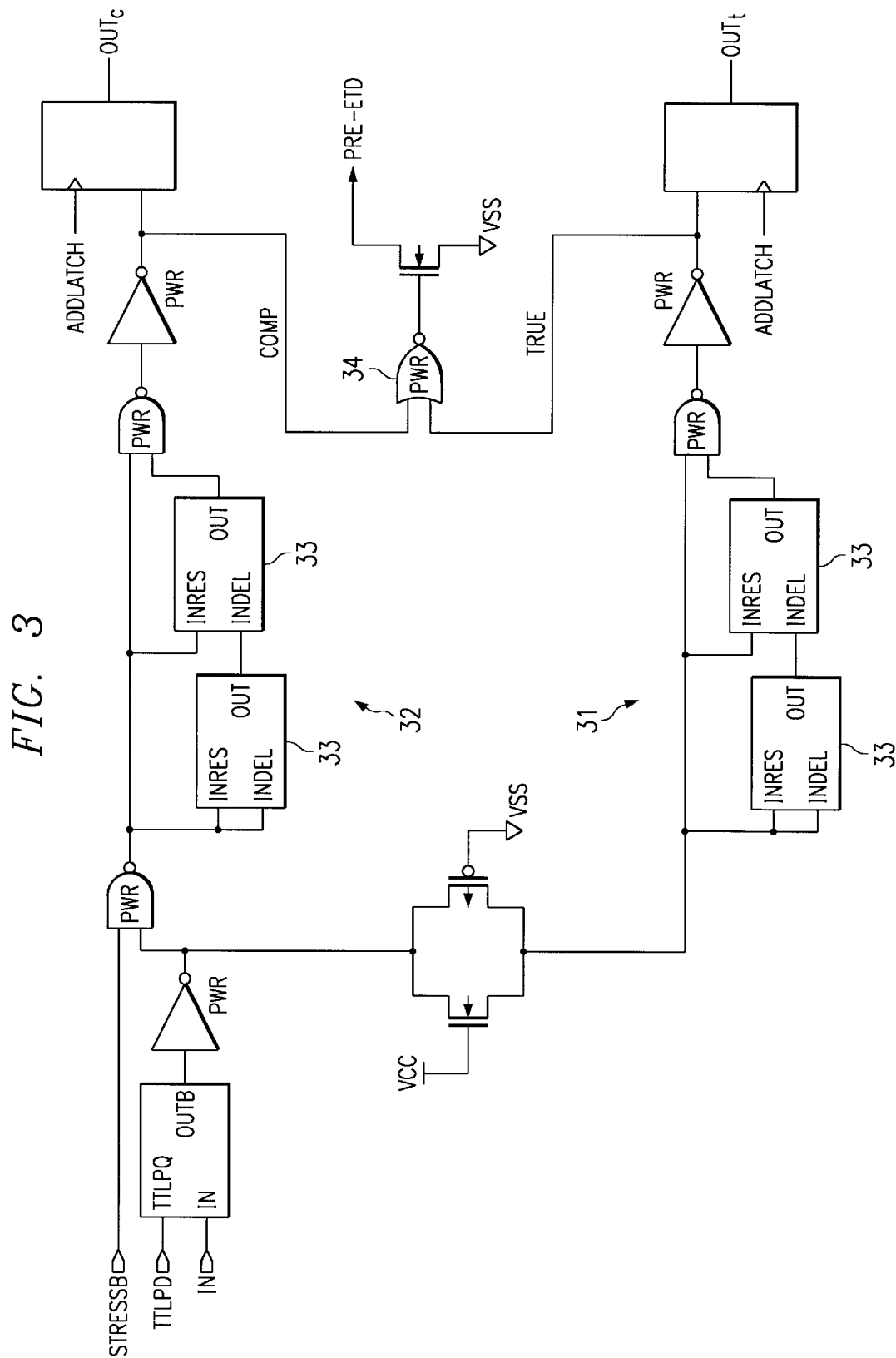
FIG. 3 is a schematic diagram of an address input buffer of the ferroelectric memory device of FIG. 2.

FIG. 3 is a schematic of a single bit slice of the address input buffer 15 according to an embodiment of the present invention. It is understood that the bit slice is replicated once for each bit of the address input buffer 15. As shown in FIG. 3, address input buffer 15 utilizes a first signal path 31 for generating the signal TRUE representing a logic true version of the corresponding bit of the address signal, and a second signal path 32 for generating the signal COMP representing a logic complement version of the corresponding address bit. Each of the first and second signal paths includes series connected delay elements 33 which provide different propagation delay times between a falling edge transition and a rising edge transition. In this way, address input buffer 15 provides input glitch tolerance and prevents false address selection, with deassertion of signals TRUE and COMP occurring prior to one of signals TRUE and COMP being asserted.

An edge transition detection (ETD) circuit 34 receives the signal TRUE and the COMP and generates a PRE-ETD signal which is connected in a wired-NOR configuration with the PRE-ETD signal of each bit slice of the address input buffer 15. Portions of address input buffer 15 involved in the generation of signals TRUE, COMP and PRE-ETD are described in greater detail in U.S. patent application No. 183,593, entitled "DEVICE AND METHOD FOR ADDRESS INPUT BUFFERING", filed Oct. 30, 1998, which is incorporated by reference herein in its entirety.

As stated above, the timing and control circuitry of memory device 1 latches the address signal applied to memory device 1 based upon signal transitions occurring in the address signal, and drives the row lines 7 of memory device 1 based upon the latched address. In particular, memory device 1 generates an edge transition detection signal ETD which is pulsed or asserted once during a memory access operation, based upon transitions in the address signal. Signal ETD is used, at the onset of a memory access operation, by row line control circuitry 17 and control circuit 13 to equilibrate and precharge the row lines 7 and suppress row line control circuitry 17 from driving a row line 7 to a voltage level that activates a row of memory cells 3. Signal ETD is also used to latch the address value in address input buffer 15.

Figure 4:
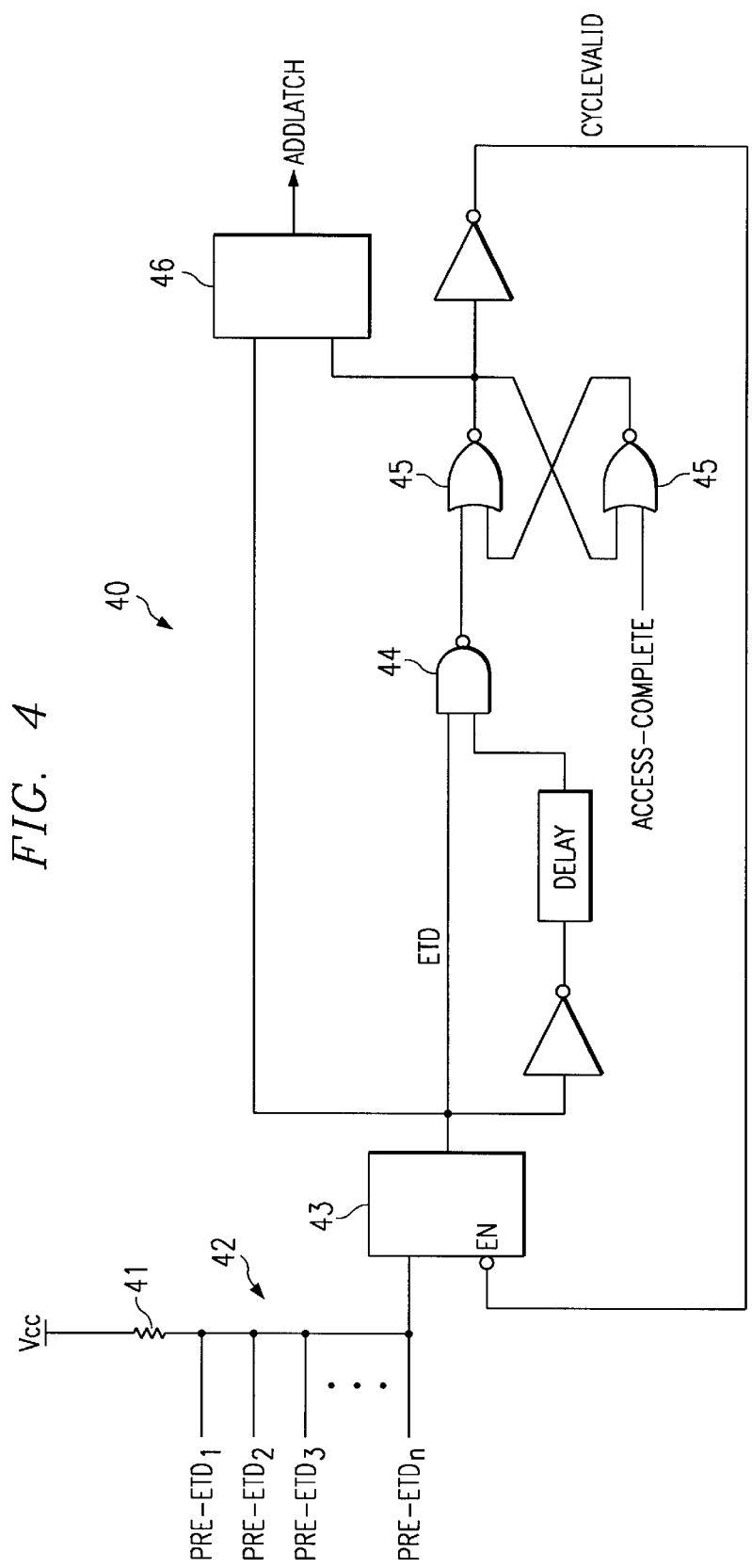
FIG. 4 is a schematic diagram of a timing circuitry of the ferroelectric memory device of FIG. 2.

FIG. 4, which is a schematic of timing circuit 40 of memory device 1, shows how signal ETD is generated. The signal PRE-ETD from each bit slice of address input buffer 15 is connected together with pull-up device 41 so as to form a wired NOR configuration. The wired NOR signal 42 is enabled/disabled by control signal CYCLEVALID to form edge transition detect signal ETD. As can be seen, the timing of signal ETD is such that signal ETD is asserted upon the occurrence of a first transition appearing on any of the bits in the address input signal. If no other signal transitions on the address input signal occurs, signal ETD will remain asserted for at least a minimum predetermined period of time. However, if one or more additional signal transitions occur on the address input signal within the minimum predetermined period of time relative to the first signal transition, such as 10ns, signal ETD will continue to remain asserted. Signal ETD will become de-asserted following a duration of the minimum predetermined period of time without any signal transition on the address input signal occurring. Address transitions following de-assertion of signal ETD will be ignored, as explained below. Alternatively, the user of memory device 1 may externally ensure address transitions will not continue well into the memory access operation.

With further reference to FIG. 4, timing circuit 40 additionally includes circuitry for generating control signal CYCLEVALID, which is asserted to suppress more than one assertion of signal ETD in a memory access cycle. A logic gate 44 receives signal ETD and a delayed, inverted version thereof. The output of logic gate 44 is an input to a flip flop 45, such as an S-R flip flop. A second input to flip flop 45 is a control signal ACCESS-COMPLETE that is asserted at the end of the memory access operation. The inverted output of flip flop 45 generates control signal CYCLEVALID. As can be seen, control signal CYCLEVALID is asserted following the de-assertion of signal ETD, and de-asserted upon the assertion of control signal ACCESS-COMPLETE at the end of the memory access operation.

Signal ETD and control signal CYCLEVALID may be used to latch the received address signal in address buffer 15. Referring to FIG. 4, signal ETD and control signal CYCLEVALID are inputs to timing circuit 46, which generates signal ADDLATCH in response. Specifically, signal ADDLATCH is asserted during the course of a memory access operation following the time signal ETD is initially asserted, and de-asserted following control signal CYCLEVALID being initially de-asserted. Referring to FIG. 3, signal ADDLATCH latches signal TRUE in latch 36 when and signal COMP in latch 37 when asserted. In this way, representations of the address input signal are latched and provided to address decode circuit 9 without being altered by subsequent transitions on the address signal during the memory access operation.

Figure 5:
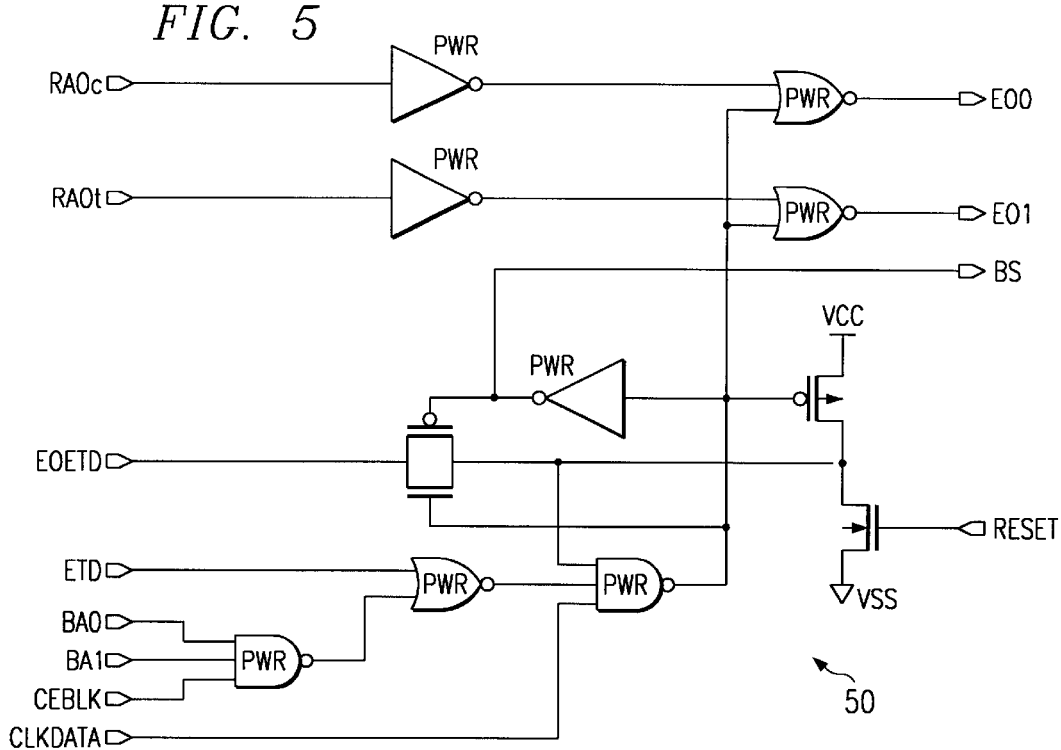
FIGS. 5 and 6 are schematic diagrams of control and driver circuitry of the ferroelectric memory device of FIG. 2.
Figure 6:
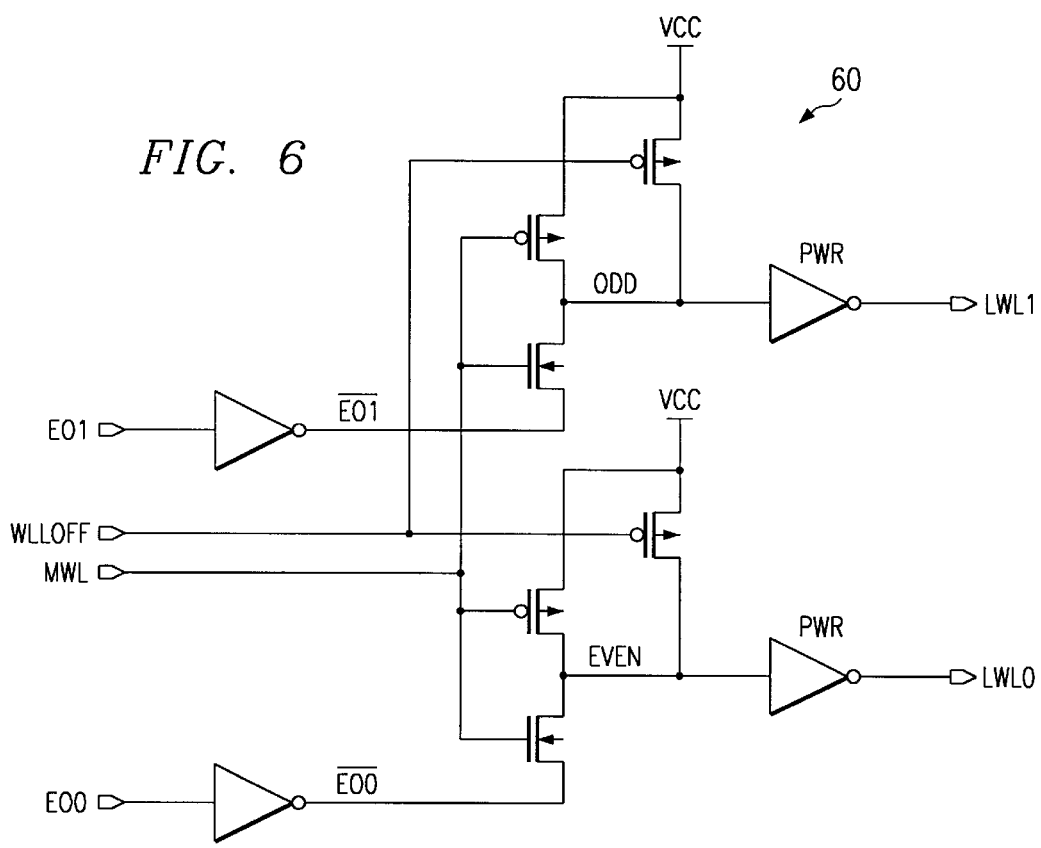

FIGS. 5 and 6 are additional circuits in row line control circuit 17 that receive signal ETD. FIG. 5 is a even/odd row select latch 50 that receives signal ETD during a memory access operation and generates signals E00 and E01. FIG. 6 is a local row line driver 60 that receives signals E00 and E01 and generates signals LWL1 and LWL0 that drive adjacent row lines 7. Local row line driver 60 is replicated a number of times so as to provide a driver circuit for each row line 7. As can be seen, when signal ETD is asserted, signals LWL1 and LWL0 are driven to the ground potential, thereby preventing glitches from appearing on the row lines 7 which may otherwise corrupt stored data.

Figure 7:
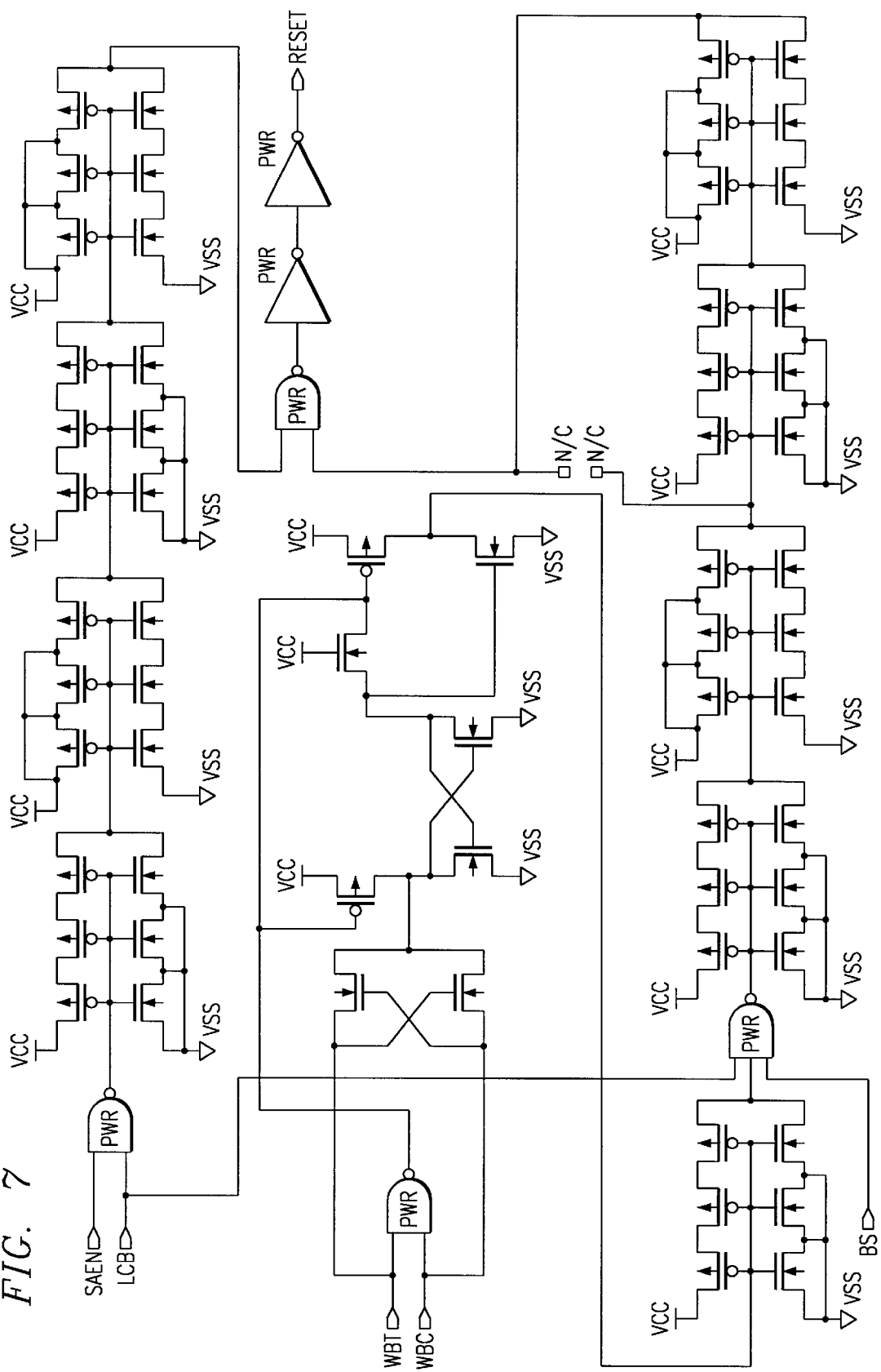
FIGS. 7 and 8 are schematic diagrams of additional control circuitry of the ferroelectric memory device of FIG. 2.
Figure 8:
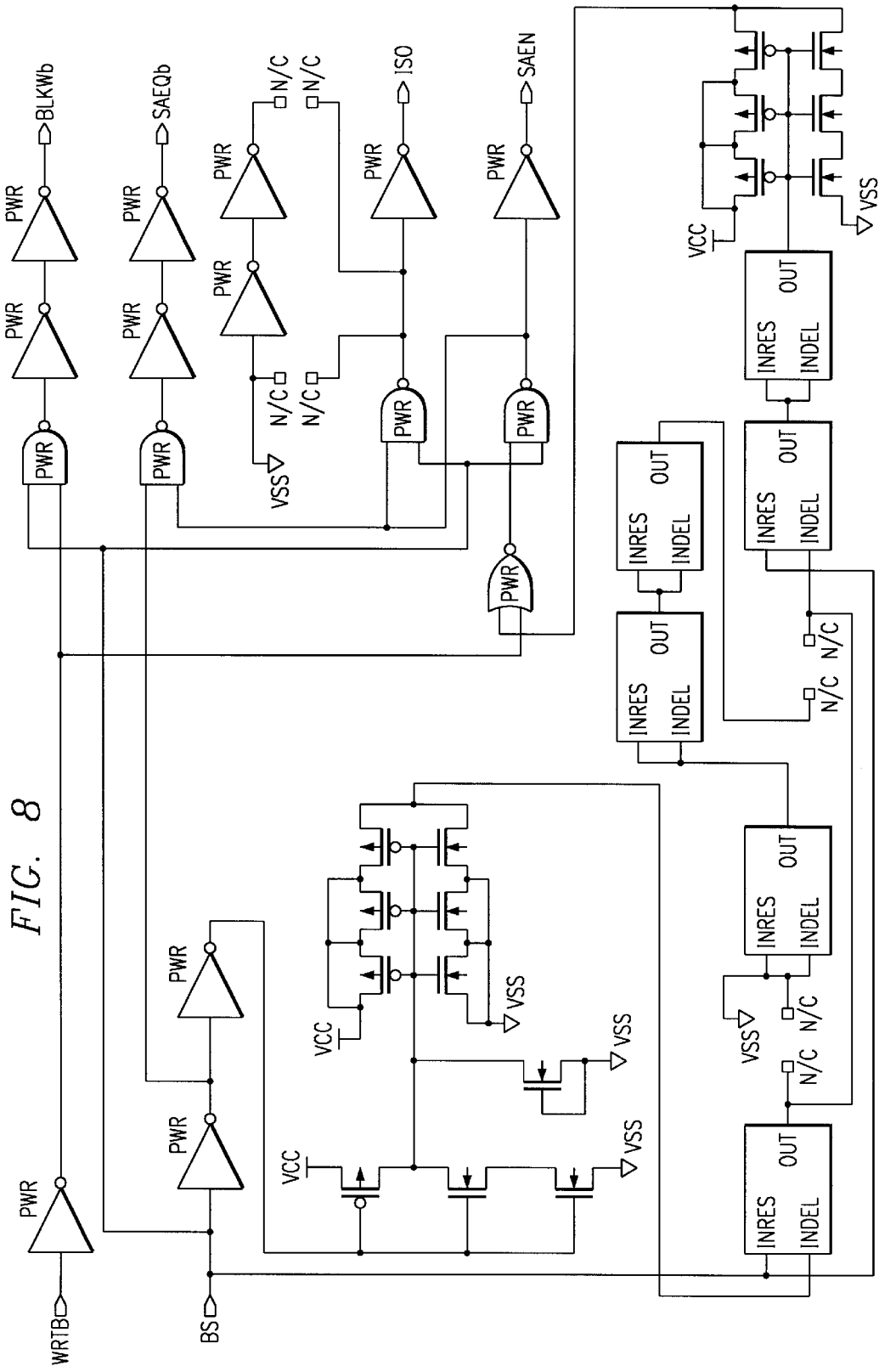

FIGS. 7 and 8 are control circuits for controlling the operation of sense amplifiers 10.

As stated above, control signal CYCLEVALID is used to disable, mask and/or prevent signal ETD from being asserted more than once in a memory access operation. This ensures that address signal transitions will not adversely effect the latched address value. As shown in FIG. 4, control signal CYCLEVALID maintains signal ETD in a de-asserted state during the time that CYCLEVALID is asserted, by disabling the wired NOR signal 42 from propagating to signal ETD.

At the conclusion of a memory access operation, control circuit 13 is adapted to generate pulse signal ACCESS-COMPLETE. As shown in FIG. 4, the assertion of pulse signal ACCESS-COMPLETE de-asserts control signal CYCLEVALID, which thereupon causes signal ADDLATCH to be de-asserted.

It is noted that instead of being enabled by signal ADDLATCH, latches 36 and 37 of address input buffer 15 may be enabled by control signal CYCLEVALID.

Figure 9:
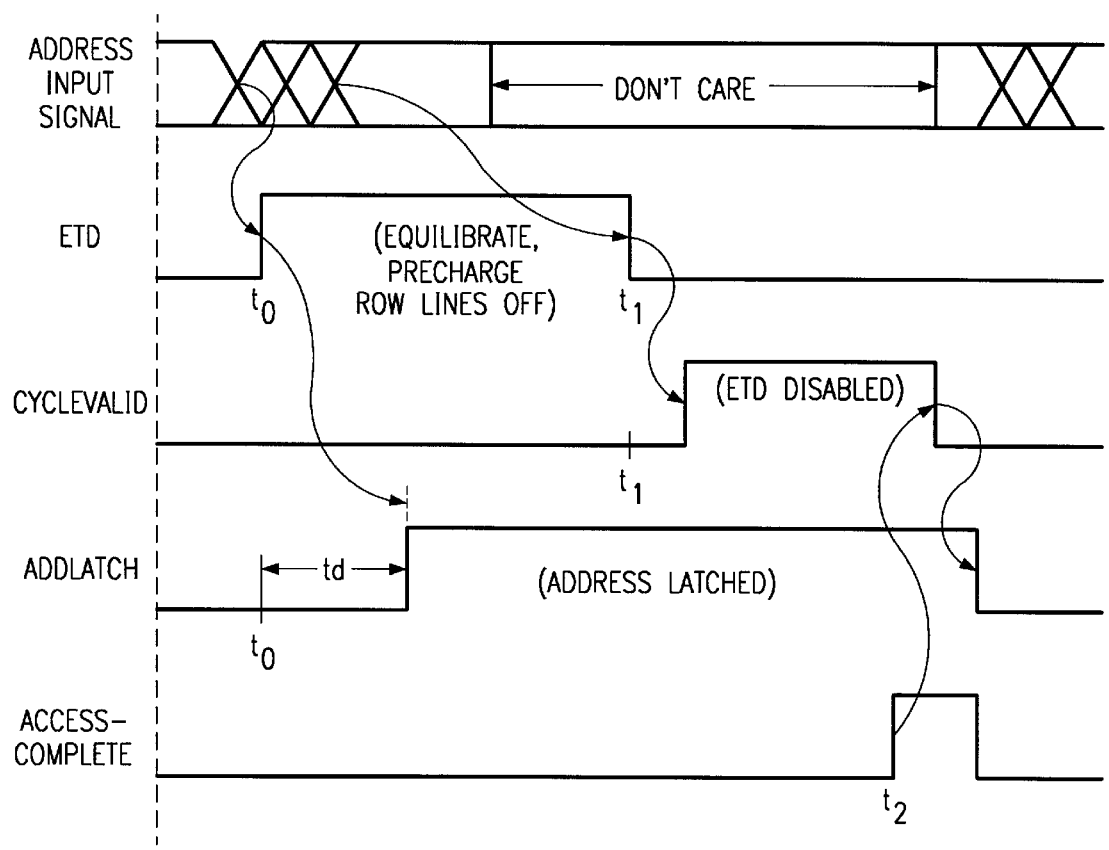
FIG. 9 is a flow chart illustration a memory access operation of the memory device of FIG. 2.

The operation of memory device 1 in performing a memory access cycle will be described with reference to the timing diagram of FIG. 9. Signal ETD is asserted at time t0 in response to an initial transition appearing on the address input signal. In response, local row line driver circuits 60 drive row lines 7 to the ground potential, and column lines 6 are precharged and equilibrated. In addition, signal ADDLATCH is asserted at a predetermined time td following time t0. The predetermined time td is chosen to allow sufficient time for the address input signal to settle. The assertion of signal ADDLATCH latches the settled address input signal, represented by signals TRUE and COMP, into latches 36 and 37.

Signal ETD is asserted for a period of time, as discussed above. Following a period of time in which no transitions occurred on the address input signal, signal ETD is de-asserted at time t1. This causes control signal CYCLEVALID to be asserted, which thereupon disables signal ETD, through enable circuit 43, from being asserted again in the memory cycle. Local row line driver circuits 60 are now capable of driving a selected row line 7 towards a high reference voltage level so that a selected row of memory cells 3 may be accessed.

Following control circuitry 13 controlling the remaining tasks of the memory access operation, signal ACCESSCOMPLETE is pulsed at time t2, which causes control signal CYCLEVALID and signal ADDLATCH to be de-asserted. At this point, control signal CYCLEVALID no longer disables or suppresses the assertion of signal ETD, and latches 36 and 37 are opened by ADDLATCH being de-asserted. Memory device 1 is now ready to begin a new memory access operation.

As can be seen, memory device 1 is capable of performing an asynchronous memory access operation (i.e., without receiving a clock or chip enable signal for latching the address input signal or otherwise synchronizing events within memory device 1) by utilizing self-timing circuits, without experiencing glitches that may destroy stored data. In addition, memory device 1 does not change the timing of the asynchronous signals that are applied thereto.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A ferroelectric memory device, comprising:
   a memory array of memory cells organized into rows and columns, including a plurality of word lines, plate lines and bit lines, each row of memory cells being coupled to a word line and a plate line and each column of memory cells being coupled to a bit line, each memory cell comprising at least one ferroelectric capacitor and at least one transistor connected thereto;
   an address input buffer and timing circuitry for receiving an address signal during a memory access operation, asserting an edge detect signal in response to at least one edge transition appearing on a bit of the address signal, and latching the address signal following the edge detect signal being asserted, the address input buffer and timing circuitry comprises edge detect circuitry for generating the edge detect signal, the edge detect circuitry being disabled from re-asserting the edge detect signal during the memory access operation;
   control circuitry for receiving the edge detect signal and equilibrating and precharging the column lines and driving the row lines to a low reference voltage level during at least a portion of the time when the edge detect signal is asserted;
   address decode circuitry for receiving the latched address signal and generating decoded output signals identifying a row of memory cells to connect to the column lines; and
   data control circuitry for coupling at least one selected column line to data input/output terminals of the ferroelectric memory device.

2. The ferroelectric memory device of claim 1, wherein:
   the address input buffer and timing circuitry comprise a self-timed circuit for enabling the edge detect signal to be asserted at the end of the memory access operation.

3. The ferroelectric memory device of claim 2, wherein:
   the address input buffer includes a latch to latch the address signal; and
   the self-timed circuit controls the latch to accept another address signal at the end of the memory access operation.

4. The ferroelectric memory device of claim 1, wherein the edge detect signal is asserted for a minimum predetermined period of time.

5. The ferroelectric memory device of claim 1, wherein edge detect circuitry includes a flip flop having an input coupled to the edge detect signal and an output that selectively enables the edge detect signal to be asserted based upon the value of the flip flop output.

6. The ferroelectric memory device of claim 5, wherein the flip flop receives a second input that is asserted upon the completion of the memory access operation.

7. The ferroelectric memory device of claim 1, wherein the address input buffer and timing circuitry transition the edge detect signal to the asserted state following a first occurring transition appearing on a bit of the address signal and transition the edge detect signal to the de-asserted state following a last occurring transition appearing on a bit of the address signal.

8. The ferroelectric memory device of claim 1, wherein the address input buffer generates a true signal representation and complement signal representation of the address signal, the true and complement signal representations being received by the address decode circuitry.

9. The ferroelectric memory device of claim 8, wherein, for each bit of the address signal, the address input buffer includes a true signal path that generates the true signal representation of the bit of the address signal and a complement signal path that generates the true signal representation of the bit of the address signal.

10. The ferroelectric memory device of claim 8, wherein the true and complement signal representations of the bits of the address signal are both de-asserted before one of the true and complement signal representations is asserted.

11. The ferroelectric memory device of claim 1, wherein the control circuitry drives a row line towards a high reference voltage level identified by the address decode circuitry following the assertion of the edge detect signal.

12. The ferroelectric memory device of claim 1, wherein the address input buffer and timing circuitry comprises a logic gate having a first input and an output that generates the edge detect signal, and a flip flop having a first input coupled to the edge detect signal and an output coupled to a second input of the logic gate.

13. The ferroelectric memory device of claim 12, wherein the address input buffer and timing circuitry further comprises a timing circuit having a first input coupled to the edge detect signal, a second input coupled to the output of the flip flop and an output that generates an enable signal that latches the address signal when asserted.

14. The ferroelectric memory device of claim 12, wherein the address input buffer and timing circuitry further comprises, for each bit of the address signal, edge detect circuitry for detecting an edge transition appearing on the address signal and a pull-up device coupled to an output of each edge detect circuit so as to form a wired-NOR configuration.

15. A method of accessing at least one memory cell of a ferroelectric memory device, comprising:

receiving an address signal;

asserting an edge detect signal in response to at least one edge transition appearing on a bit of the address signal;

latching the address signal following the assertion of the edge detect signal;

following assertion of the edge detect signal, preventing reassertion of the edge detect signal for the duration of the accessing of the at least one memory cell;

equilibrating and precharging column lines of the ferroelectric memory device and driving the row lines thereof to a predetermined reference voltage level during at least a portion of the time when the edge detect signal is asserted;

generating decoded output signals identifying a row of memory cells to connect to the column lines based upon the latched address signal; and coupling at least one selected column line to data input/output terminals of the ferroelectric memory device.

16. The method of claim 15, wherein the asserting comprises transitioning the edge detect signal to the asserted state following a first occurring transition appearing on a bit of the address signal and transitioning the edge detect signal to the de-asserted state following a last occurring transition appearing on a bit of the address signal, the edge detect signal having at least a minimum pulsewidth.

17. The method of claim 16, further comprising:

generating a true signal representation and complement signal representation of each bit of the address signal;

wherein the latching of the address signal comprises latching the true and complement representations of the bits of the address signal.

18. The method of claim 17, wherein the generating of the true and complement signal representations comprises deasserting the true and complement signal representations for a period of time and thereafter asserting one of the true and complement signal representations based upon the corresponding bit of the address signal.

19. The method of claim 15, wherein:

the edge detect signal is asserted for at least a minimum predetermined period of time.

20. An integrated circuit, comprising:

an asynchronous ferroelectric memory device for performing asynchronous memory access operations, including an address input buffer for latching at least one signal representative a of received address signal based upon edge transitions appearing thereon, the address input buffer including edge transition circuitry for transitioning, during an asynchronous memory access operation, an edge detect signal to a first logic state upon a first transition appearing on the received address signal and a latch for latching the at least one signal representative of the address signal during at least a portion of the time the edge detect signal is in the first logic state, the edge detect circuitry preventing the edge detect signal from transitioning to the first logic state more than once during the remainder of the asynchronous memory access operation.

21. The integrated circuit of claim 20, wherein the asynchronous ferroelectric memory device further comprises:

an address decode circuit for receiving the latched signal from the address input buffer and generating a decoded output signal; and a control circuit for driving a row line of the asynchronous ferroelectric memory device based upon the decoded output signal and the edge detect signal.

* * * * *

UNITED STATES PATENT AND TRADEMARK OFFICE
CERTIFICATE OF CORRECTION

PATENT NO. : 6,456,519 B1
DATED : September 24, 2002
INVENTOR(S) : David C. McClure It is certified that error appears in the above-identified patent and that said Letters Patent is hereby corrected as shown below:

Title page,
Item [57], ABSTRACT,
Line 2, replace "accessing accessing a ferroelectric" with -- accessing a ferroelectric --
Line 13, replace "random access random access memory" with -- random access memory --

Column 2,
Line 53, replace "a s an asynchronous" with -- as an asynchronous --

Column 6,
Line 65, replace "at time to" with -- at time t0 --

Signed and Sealed this

Twenty-third Day of September, 2003

JAMES E. ROGAN
*Director of the United States Patent and Trademark Office*